United States Patent [19]
Kukulinsky

[11] Patent Number: 4,839,611
[45] Date of Patent: Jun. 13, 1989

[54] VOLTAGE CONTROLLED HIGH-FREQUENCY ATTENUATOR

[75] Inventor: David H. Kukulinsky, Stow, Mass.

[73] Assignee: Digital Equipment Corporation, Maynard, Mass.

[21] Appl. No.: 164,817

[22] Filed: Mar. 7, 1988

[51] Int. Cl.[4] .............................................. H03G 3/30
[52] U.S. Cl. ................................... 330/284; 330/145
[58] Field of Search ................ 330/59, 144, 145, 284, 330/308; 250/214 AG; 333/81 R; 455/619

[56] References Cited

FOREIGN PATENT DOCUMENTS 0012413 1/1983 Japan ................................... 330/284

OTHER PUBLICATIONS

Tajima et al., "GaAs Monolithic Wideband (2–18 GHz) Variable Attenuators", *1982 IEEE MTT-S Digest*, pp. 479–481.
"FETs as Voltage-Controlled Resistors", Siliconix, Inc., Santa Clara, CA 95054 (1986), pp. 7–75 to 7–83.
Product Sheet for Topaz Semiconductor CDG4469.
"DMOS FET Analog Switches and Switch Arrays", Siliconix, Inc., Santa Clara, CA 95054 (1986), pp. 7–92 to 7–99.

*Primary Examiner*—James B. Mullins
*Attorney, Agent, or Firm*—Fish & Richardson

[57] ABSTRACT

A continuously variable, passive attenuator including a signal path between an attenuator input node and an attenuator output node, the signal path including a passive resistive element connected between the input and output nodes, and a semiconductor element having a first terminal connected to the resistive element, a second terminal connected to a reference voltage, and a third terminal connected to a control signal node, the resistance of the semiconductor element between the first and second terminals being continuously variable as a function of the value of a control signal provided to the third terminal, the capacitance of the semiconductor element always being lessw than 4 pf.

24 Claims, 1 Drawing Sheet

VOLTAGE CONTROLLED HIGH-FREQUENCY ATTENUATOR

FIELD OF THE INVENTION

The present invention relates to a high frequency attenuator, e.g., an attenuator used with an automatic gain control circuit in the receiver of a fiber optic link.

BACKGROUND OF THE INVENTION

Automatic gain control (AGC) is used to proportionally adjust the voltage of an input analog signal to provide an output signal within a desired range, e.g., required by downstream signal processing. Amplifiers having AGC employ active components that are in the signal path between the input and output and cause changes in phase with changes in gain, something which cannot be tolerated in some applications, e.g., those employing multiple channels.

Attenuators proportionally reduce the voltage of an input analog signal and can be used with an AGC circuit that senses a resulting output and controls the attenuator so as to keep the output within a desired range. Passive attenuators include only passive elements (e.g., resistors) in the signal path between the signal input and output, thereby avoiding phase change with change in gain. The so called "T-pad" attenuator circuit employs fixed value resistors in the signal path between the input and output and a variable resistance between the signal path and ground. The circuit acts as a voltage divider and can be provided in stages to increase attenuation. The variable resistances have been provided by electromechanical potentiometers and by low speed voltage controlled devices, e.g., junction field effect transistors (JFETs), as described in "FETs As Voltage-Controlled Resistors", Siliconix, Inc., Santa Clara, Calif. 95054 (1986) pp. 7-75 to 7-83.

An application requiring an ultrahigh frequency (UHF), passive attenuator is the receiver of a fiber optic link transmitting frequencies up to 300 MHz and greater.

A known high-frequency attenuator, capable of frequencies up to 15 MHz, is available from Topaz Semiconductor under the CDG4469 trade designation. It employs digital input logic to control eight voltage dividers in series. Each divider has a resistance between the signal path and ground of a different value, and these resistances are selectively switched to ground via respective high-speed, low-capacitance, double diffusion metal-oxide semiconductor (DMOS) field-effect transistor (FET) switches controlled by the input logic. By selectively connecting different combinations of the dividers, 0 to 127.5 dB can be provided in 0.5 dB steps.

SUMMARY OF THE INVENTION

In general the invention features a continuously variable, passive attenuator that includes a passive resistive element along a signal path between input and output nodes and a semiconductor element that has first and second terminals connecting it between the resistive element and a reference voltage (i.e., ground) and a third terminal for receiving a control signal. The resistance of the semiconductor element between the first and second terminals is continuously variable as a function of the value of the control signal, and the capacitance of the semiconductor element is always less than 4 pf. The attenuator provides continuously variable attenuation of a wide band of frequencies without differential phase delay.

In preferred embodiments the semiconductor element is a DMOS FET having a capacitance less than 2 pf (preferably about 1.5 pf or lower) and an on-resistance below 100 ohms (preferably about 50 ohms or lower); the resistive element has a resistance of less than 60 ohms (preferably about 30 ohms or lower); there are a plurality of stages of resistive elements and DMOS FETs, the latter being provided on a common integrated circuit package; the control signal is provided by an AGC circuit that maintains an output within a desired range; and the input signal is provided by an optical to electrical converter.

Other advantages and features of the invention will be apparent from the following description of the preferred embodiment thereof and from the claims.

DESCRIPTION OF THE PREFERRED EMBODIMENT

The preferred embodiment will now be described.

DRAWINGS

STRUCTURE

Figure 1:
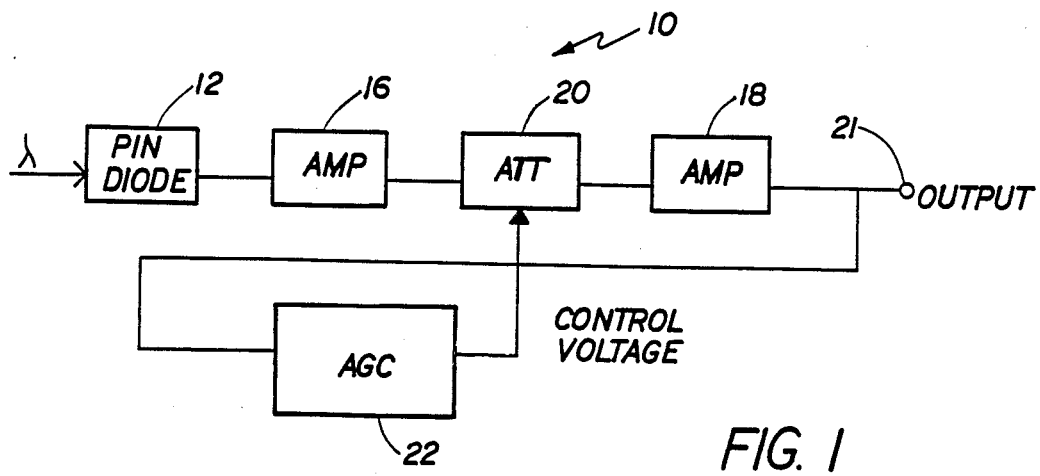
FIG. 1 is a block diagram of a receiver of a fiber optic link employing a voltage controlled attenuator according to the invention.

Referring to FIG. 1, there is shown receiver 10 for one of three fiber-optic links between a computer graphics workstation and a remote color monitor. Receiver 10 is used to convert an optical signal input into a proportionally valued electrical signal output and makes up one of three identical channels across which differential phase delay cannot be tolerated. Receiver 10 includes pin diode 12 (for converting the optical input to an electrical output), first and second amplifier stages 16 and 18, attenuator 20 between the amplifier stages, and AGC circuit 22, connected to sample the output of second amplifier stage 18 at node 21 and to use it to provide a 2.0 to 3.5 volt control voltage to control attenuation by attenuator 20.

Figure 2:
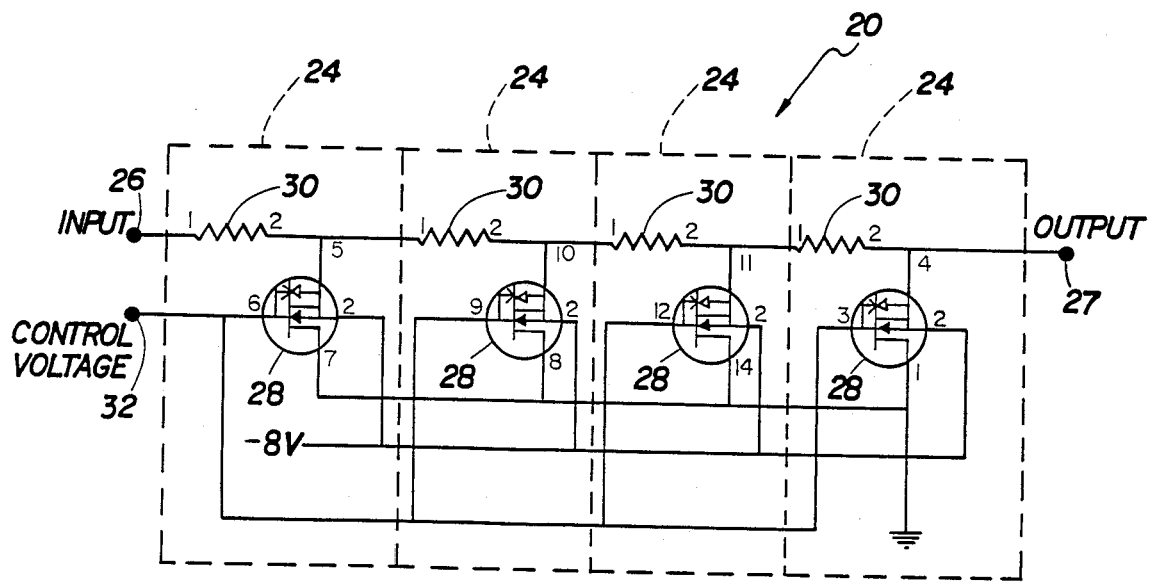
FIG. 2 is a schematic of the FIG. 1 attenuator.

Referring to FIG. 2, attenuator 20 includes four attenuator stages 24, each of which includes a high-speed, metal-film, 30 ohm resistor 30 in the signal path between attenuator input node 26 and output node 27 and a DMOS FET 28 connected, via its drain and sink, between the respective resistor 30 and ground. The gates of all DMOS FETs 28 are connected to receive the control voltage at node 32 from AGC circuit 22 (FIG. 1). The four DMOS FETs 28 are part of a common quad device available under the SD5400 trade designation from Topaz Semiconductor, Inc. It has a drain-to-gate capacitance of 1.5 pf and an on-resistance of 50 ohms. DMOS FETs typically have capacitance between 1 and 2 pf, which is much lower than that of JFETs and complementary metal-oxide-semiconductor (CMOS) FETs, typically having capacitances of 6 pf or higher.

Operation

In operation, an optical signal input received over a fiber-optic link is converted by pin diode 12 into a proportionally-valued voltage. This voltage is in turn amplified by amplifier stage 16, variably attenuated by attenuator 20, and amplified by amplifier stage 18 to provide the receiver output at node 21. The receiver output is sampled by AGC circuit 22 and used (employing well-known closed loop techniques) to provide a 2.0 to 3.5 volt control voltage to attenuator 20 to control its attentuation so as to provide a receiver output that has peak-to-peak amplitude less than 1 volt to meet NTSC video signal requirements of downstream processing.

In attenuator 20, the four attenuator stages 24 successively attenuate the electrical signal at input node 26. In each attenuator stage 24, DMOS FET 28 behaves as a voltage-controlled resistor, with the resistance between its drain (connected to resistor 30) and sink (connected to ground) varying in response to the value of the variable control voltage provided at its gate. Resistor 30 and DMOS FET 28 thus form a voltage divider, and the attenuation of the input signal is a function of the control voltage from AGC circuit 22. As the control voltage varies from 2.0 to 3.5 volts, the drain-to-sink voltage goes from a very high value to 50 ohms. The capacitance between the drain of DMOS FET 28 and ground is a maximum of 1.5 picofarads. Thus, the maximum time constant of attenuator stage 24 is 45 picoseconds (30 ohms times 1.5 pf). The time constant for all four stages is 180 picoseconds.

By varying the control voltage provided to attenuator 20 between 2.0 and 3.5 volts, the output continuously decreases 70% (10 dB) and does so in a linear manner (within %10), something which would permit open-loop control. Because of the low time constant, very high-frequency signals pass through attenuator 20 without it acting as a filter. (The circuit has provided linear response in testing up to 500 MHz and should work over 1000 MHz.) Because there are no active elements along its signal path, attenuator 20 avoids phase shifting of the receiver output; attenuator 20 exhibits a propagation delay at low frequencies of 1 nanosecond and an incremental phase delay at 300 MHz of 1 nanosecond. Attenuator 20 has a low impedance of 120 ohms (4 times the 30 ohm resistance of resistor 30), and the low impedance of DMOS FET 28 (on-resistance of 50 ohms) provides good attenuation in the voltage divider with resistor 30. In addition, the simplicity of attenuator 20 permits all of these desirable performance characteristics at low cost.

Other Embodiments

Other embodiments of the invention are within the scope of the following claims. The invention can be very advantageously used in any application where minimal phase shift and wideband response is imperative, e.g., other fiber optic transmissions (e.g., computer-to-computer or computer-to-memory) and in non-optic fiber applications (e.g., radar or television reception).

What is claimed is:

1. A continuously variable, passive attenuator comprising
    a signal path between an attenuator input node and an attenuator output node,
    said signal path including a passive resistive element connected between said input and output nodes, and
    a semiconductor element having a first terminal connected to said resistive element, a second terminal connected to a reference voltage, and a third terminal connected to a control signal node,
    the resistance of said semiconductor element between said first and second terminals being continuously variable as a function of the value of a control signal provided to said third terminal,
    the capacitance of said semiconductor element always being less than 4 pf.

2. The attenuator of claim 1 wherein the capacitance of said semiconductor element is always less than 2 pf.

3. The attenuator of claim 2 wherein said resistive element has a resistance below 60 ohms.

4. The attenuator of claim 3 wherein said semiconductor element has an on-resistance below 100 ohms.

5. The attenuator of claim 2 wherein said semiconductor element is a DMOS FET.

6. The attenuator of claim 5 wherein said DMOS FET has an on-resistance below 100 ohms, and said resistive element has a resistance below 60 ohms.

7. The attenuator of claim 1 wherein said attenuator has a plurality of stages in series, each said stage including a said resistor along said signal path and a said semiconductor element connected between said signal path and ground and controlled by said control voltage.

8. The attenuator of claim 7 wherein each said semiconductor element is part of a common integrated circuit package.

9. The attenuator of claim 7 wherein said semiconductor element is a DMOS FET having an on-resistance below 100 ohms and a capacitance below 2 pf, and said resistive element has a resistance below 60 ohms.

10. The attenuator of claim 9 wherein said DMOS FET has a capacitance of about 1.5 pf or lower and an on-resistance of about 50 ohms or lower, and said resistive element has a resistance of about 30 ohms or lower.

11. The attenuator of claim 7 wherein there are four said stages.

12. A gain controlled circuit comprising
    a signal path between a circuit input node and a circuit output node,
    a continuously variable, passive attenuator including a passive resistive element along said path and a semiconductor element having a first terminal connected to said resistive element, a second terminal connected to a reference voltage, and a third terminal connected to a control signal node,
    the resistance of said semiconductor element between said first and second terminals being continuously variable as a function of the value of a control signal provided to said third terminal,
    the capacitance of said semiconductor element always being less than 4 pf, and
    an automatic gain controller connected to receive the output of said circuit at said circuit output node and provide a control signal to said third terminal so as to control the attenuation provided by said attenuator to maintain said output of said circuit within a predetermined range.

13. The circuit of claim 12 wherein the capacitance of said semiconductor element is always less than 2 pf.

14. The circuit of claim 13 wherein said resistive element has a resistance below 60 ohms.

15. The circuit of claim 14 wherein said semiconductor element has an on-resistance below 100 ohms.

16. The circuit of claim 13 wherein said semiconductor element is a DMOS FET.

17. The circuit of claim 16 wherein said DMOS FET has an on-resistance below 100 ohms, and said resistive element has a resistance below 60 ohms.

18. The circuit of claim 12 wherein said attenuator has a plurality of stages in series, each said stage including a said resistor along said signal path and a said semiconductor element connected between said signal path and ground and controlled by said control voltage.

19. The circuit of claim 18 wherein each said semiconductor element is part of a common integrated circuit package.

20. The circuit of claim 18 wherein said semiconductor element is a DMOS FET having an on-resistance below 100 ohms and a capacitance below 2 pf, and said resistive element has a resistance below 60 ohms.

21. The circuit of claim 20 wherein said DMOS FET has a capacitance of about 1.5 pf or lower and an on-resistance of about 50 pf or lower, and said resistive element has a resistance of about 30 ohms or lower.

22. The circuit of claim 18 wherein there are four said stages.

23. The circuit of claim 12 further comprising means to convert an optical signal to an electrical signal provided to said circuit input node.

24. A continuously variable, passive attenuator comprising
- a signal path between an attenuator input node and an attenuator output node,
  - said signal path including a passive resistive element connected between said input and output nodes, and
- a DMOS FET having a first terminal connected to said resistive element, a second terminal connected to a reference voltage, and a third terminal connected to a control signal node,
  - the resistance of said semiconductor element between said first and second terminals being continuously variable as a function of the value of a control signal provided to said third terminal.

* * * * *